US012755795B2

(12) United States Patent
Raghunathan et al.

(10) Patent No.: US 12,755,795 B2
(45) Date of Patent: Oct. 6, 2026

(54) SENSE VOLTAGE ADJUSTMENT AMONG MULTIPLE ERASE BLOCKS

(71) Applicant: Micron Technology, Inc., Boise, ID (US)

(72) Inventors: Shyam Sunder Raghunathan, Woodlands (SG); Akira Goda, Setagaya (JP); Kishore K. Muchherla, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 18/749,198

(22) Filed: Jun. 20, 2024

(65) Prior Publication Data

US 2025/0006275 A1 Jan. 2, 2025

Related U.S. Application Data

(60) Provisional application No. 63/524,289, filed on Jun. 30, 2023.

(51) Int. Cl.

*G11C 16/16* (2006.01)
*G11C 16/04* (2006.01)
*G11C 16/26* (2006.01)

(52) U.S. Cl.

CPC .............. *G11C 16/16* (2013.01); *G11C 16/26* (2013.01); *G11C 16/0483* (2013.01)

(58) Field of Classification Search

CPC ..... G11C 16/16; G11C 16/26; G11C 16/0483; G11C 11/5642

See application file for complete search history.

(56) References Cited

U.S. PATENT DOCUMENTS

| | | | | |
|---|---|---|---|---|
| 7,177,977 | B2 | 2/2007 | Chen | |
| 7,196,928 | B2 * | 3/2007 | Chen | G11C 11/5642 365/185.11 |
| 8,542,530 | B2 | 9/2013 | Hemink | |
| 9,786,375 | B2 | 10/2017 | Goda | |
| 10,229,740 | B2 | 3/2019 | Cai | |
| 11,145,356 | B2 * | 10/2021 | Tsai | G11C 11/4091 |

(Continued)

OTHER PUBLICATIONS

Wei-Chen Chen et al., "Study of the programming sequence induced back-pattern effect in split-page 3D vertical-gate (VG) NAND flash," Proceedings of Technical Program—2014 International Symposium on VLSI Technology, Systems and Application (VLSI-TSA), Hsinchu, Taiwan. (Year: 2014).*

*Primary Examiner* — Han Yang
*Assistant Examiner* — Christopher Lane Reece
(74) *Attorney, Agent, or Firm* — Brooks, Cameron & Huebsch, PLLC

(57) ABSTRACT

An apparatus can comprise a memory array comprising multiple erase blocks coupled to a same plurality of strings of memory cells. Control circuitry can be configured to: receive a command corresponding to a sensing operation to be performed on a selected access line of a first group of access lines corresponding to a first erase block; and determine an adjusted sense voltage to be applied to the selected access line in association with performing the sensing operation. The adjusted sense voltage is based on: a quantity of the first group of access lines that are programmed; or a quantity of the second group of access lines that are programmed; or both.

16 Claims, 10 Drawing Sheets

(56) References Cited

U.S. PATENT DOCUMENTS

| | | | | |
|---|---|---|---|---|
| 2011/0194350 | A1* | 8/2011 | Vali | G11C 16/10<br>365/185.17 |
| 2014/0136765 | A1* | 5/2014 | Oh | G11C 16/0483<br>711/103 |
| 2018/0012667 | A1* | 1/2018 | Costa | G11C 16/0483 |
| 2020/0243147 | A1* | 7/2020 | Yang | G11C 16/16 |

* cited by examiner

| | | 371 | 373 |
|---|---|---|---|
| | | PROGRAM TOP DECK | READ/PROGRAM VERIFY TOP DECK |
| 320 | BL | 0V | 0.5V |
| 326 | SGD | 3V | 5V |
| 305-1 | UNSELECTED WL (TOP) | Vpass (10V) | Vpassr (8V) |
| | . . . | . . . | . . . |
| | UNSELECTED WLn-1 (TOP) | Vpass (10V) | Vpassr1 (8.5V) |
| | SELECTED WLn (TOP) | Vpgm (20V) | Vread (0V-7V) |
| | UNSELECTED WLn+1 (TOP) | Vpass (10V) | Vpassr1 (8.5V) |
| | . . . | . . . | . . . |
| | UNSELECTED WL (TOP) | Vpass (10V) | Vpassr (8V) |
| | DUMMY WL(s) | Vpass (10V) | Vpassr_v |
| 305-2 | UNSELECTED WL (BOTTOM) | Vpass (10V) | Vpassr_v |
| | . . . | . . . | . . . |
| | UNSELECTED WL (BOTTOM) | Vpass (10V) | Vpassr_v |
| 327 | SGS | 0V | 5V |
| 329 | SL | 2V | 0V |

Fig. 3B

| DECK SELECTED FOR READ (461) | READ OFFSET DUE TO DECK1 (463) | READ OFFSET DUE TO DECK2 (465) |
|---|---|---|
| DECK1 (E.G., BOTTOM) | A 467-1 | B 467-2 |
| DECK2 (E.G., TOP) | C 469-1 | D 469-2 |

Fig. 4

SENSE VOLTAGE ADJUSTMENT AMONG MULTIPLE ERASE BLOCKS

PRIORITY INFORMATION

This application claims the benefits of U.S. Provisional Application No. 63/524,289, filed on Jun. 30, 2023, the contents of which are incorporated herein by reference.

TECHNICAL FIELD

Embodiments of the disclosure relate generally to memory systems, and more specifically, relate to apparatuses and methods for sense voltage adjustment among multiple erase blocks.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3B is a table illustrating bias voltages associated with performing operations on a memory array having multiple erase blocks per string in accordance with various embodiments of the present disclosure.

FIG. 4 is a table illustrating offset factors that can be used to adjust sense voltages in association with performing sensing operations on a memory array having multiple erase blocks per string in accordance with various embodiments of the present disclosure.

DETAILED DESCRIPTION

Figure 1:
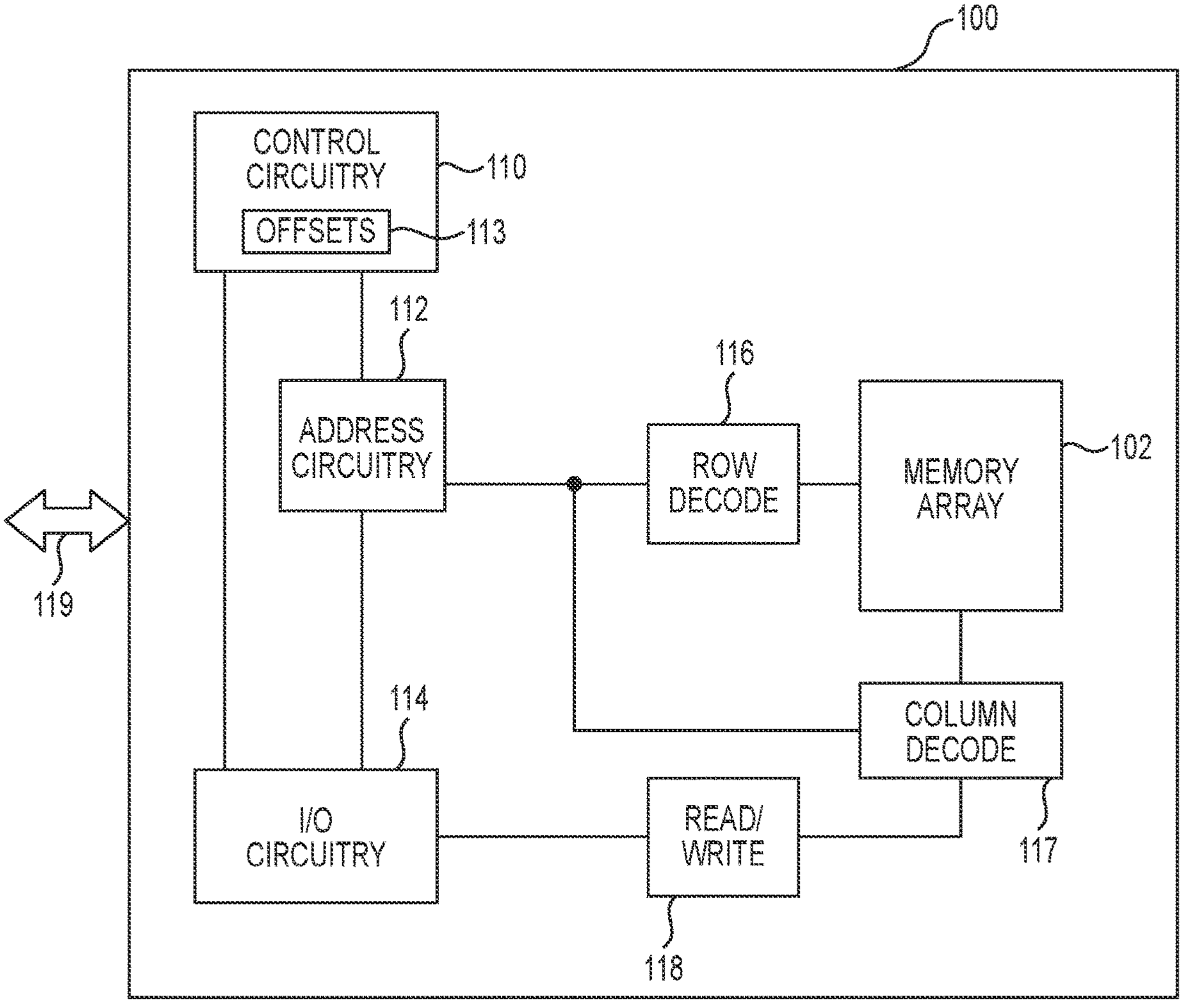
FIG. 1 illustrates an example portion of a memory system including a memory device having and array in accordance with various embodiments of the present disclosure.

Aspects of the present disclosure are directed to apparatuses and methods for sense voltage adjustment among multiple erase blocks which may be coupled to a same string. Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one or more bits by adjusting the charge stored on the storage node. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

A 3D memory array can comprise multiple physical blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells of a block while maintaining data in other memory cells of the block.

Some prior approaches that may provide an ability to erase some memory cells of a block while maintaining data in other memory cells of the block can suffer various drawbacks. For example, cells within a block are often programmed in order from a source side to a drain side or vice versa. One issue with programming in this manner is that the conductivity of the shared channel changes as programming progresses along the string such that the sensed threshold voltage (Vt) of a cell depends on the programmed statuses of the other cells in the string (e.g., referred to as "back pattern" effect). Therefore, a sense voltage (e.g., bias voltage applied to the selected word line being read during a read or program verify operation) associated with determining the state of a selected memory cell may require adjustment depending on the programmed status of other cells in the string in order to avoid sensing inaccuracies, which can lead to data loss, increased error recover operations, increased bit error rates (BERs), etc.

Such back pattern effects can become an increased issue/concern in memory array architectures in which a physical block of memory cells comprises multiple erase blocks (e.g., groups coupled to a same string but separately erasable). For example, since the cells of the respective erase blocks are coupled to a same string, the program states of the respective erase blocks affect each other.

Various embodiments of the present disclosure address the above and other deficiencies by providing apparatuses and methods that can determine appropriate sensing operation bias voltage adjustments (e.g., sense voltage adjustments and/or read pass voltage adjustments) among multiple erase blocks, which may be coupled to a same string, in order to mitigate back pattern effects, for example.

As used herein, an "erase block" refers to a group of cells that are configured to be erased together as a group and that share a same string as one or more additional groups of cells (e.g., one or more additional erase blocks). An erase block may also be referred to as a "deck." As such, a physical block of cells can include multiple decks each capable of undergoing program/erase cycling irrespective of the other decks. Decks experiencing disturb due to operations (e.g., read operations, program verify operations) performed on one or more other decks sharing a string are referred to as "victim" decks, with the one or more other decks being referred to as "aggressor" decks.

As described further herein, various embodiments can include an apparatus comprising a memory device coupled to an external controller (e.g., a system controller). The memory device can include a memory array having a plurality of erase blocks. The external controller can be configured to track respective erase block program state statuses for the plurality of erase blocks and provide, to the memory device: a command corresponding to a sensing operation to be performed on a selected access line of a first group of access lines corresponding to a first erase block; and erase block program state information corresponding to the first erase block (and/or one or more additional erase blocks). The memory device can be configured to determine an offset by which a sense voltage to be applied to the selected access line is to be adjusted in association with performing the sensing operation based on the provided erase block program state information corresponding to the first erase block (and/or the one or more additional erase blocks).

The erase block program state information can include information such as how many of the access lines of the erase block are programmed, or which portion (e.g., ⅛, ¼, ⅜, ½, ¾, etc.) of a total quantity of access lines of the erase block are programmed. In various embodiments, the sense voltage offset can also be determined based on the programmed state of one or more additional erase blocks (e.g., one or more additional decks). Various embodiments can also include adjusting read pass voltages applied to unselected access lines of the selected erase block and/or unselected erase blocks based on deck-state tracking (e.g., by the external controller).

FIG. 1 illustrates an example portion of a memory system including a memory device 100 having and array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 890 described in FIG. 8.

The memory device 100 includes control circuitry 110, address circuitry 112, input/output (I/O) circuitry 114 used to communicate with an external device via an interface 119, which may be a bus used to transmit data, address, and control signals, among other signals between the memory device 100 and an external host device, which can include a controller (e.g., system controller such as controller 891 shown in FIG. 8), host processor (e.g., host 892 shown in in FIG. 8), etc., that is capable of accessing the memory array 102. As an example, the memory device 100 can be within a system such as an SSD with the interface 119 coupling the memory device 100 to a system controller. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface, a serial attached SCSI (SAS), a serial AT attachment (SATA) interface, a peripheral component interconnect express (PCIe) interface, an I2C/I3C interface, and/or other suitable interface (e.g., a parallel interface); however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations (and can include program verify operations), data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof. In various embodiments, the control circuitry 110 can include a component 113 that can determine appropriate bias voltage offsets (e.g., read voltage offsets, program verify voltage offsets, and/or read pass voltage offsets) to apply to access lines of the array 102 in association with performing sensing operations. As described further herein, the particular bias voltage offset values can be determined based on erase block program state information, which can be tracked by an external device (e.g., system controller) and provided to the memory device 100 via interface 119 along with (or as part of) particular commands (e.g., NAND commands). The erase block program state information can include, for example, a quantity of access lines programmed in one or more erase blocks, a percentage or fraction of the total quantity of access lines programmed, etc. Although shown as being within the control circuitry 110, the component 113 can be located elsewhere in the device 100 and can be implemented in the form of hardware, firmware, or software, or any combination thereof. Although not shown in FIG. 1, the memory device 100 can include a table (e.g., a lookup table) used to determine designated offset voltages (e.g., read or program verify voltages based on the received erase block program state information, for example.

The I/O circuitry 114 is used for bi-directional communication of data between the memory array 102 and the external device via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102. As described further herein, the sensed voltage and/or current changes on the bit lines can be affected (e.g., changed) by the program status of a selected erase block and other erase blocks (e.g., erase blocks coupled to a same string) due to back pattern effects, for example. Therefore, the propriety of a given sense voltage (e.g., read or program verify voltage) used to determine the state of memory cells coupled to a selected word line is variable depending on the program status of the erase blocks when the sensing operation occurs.

Figure 2:
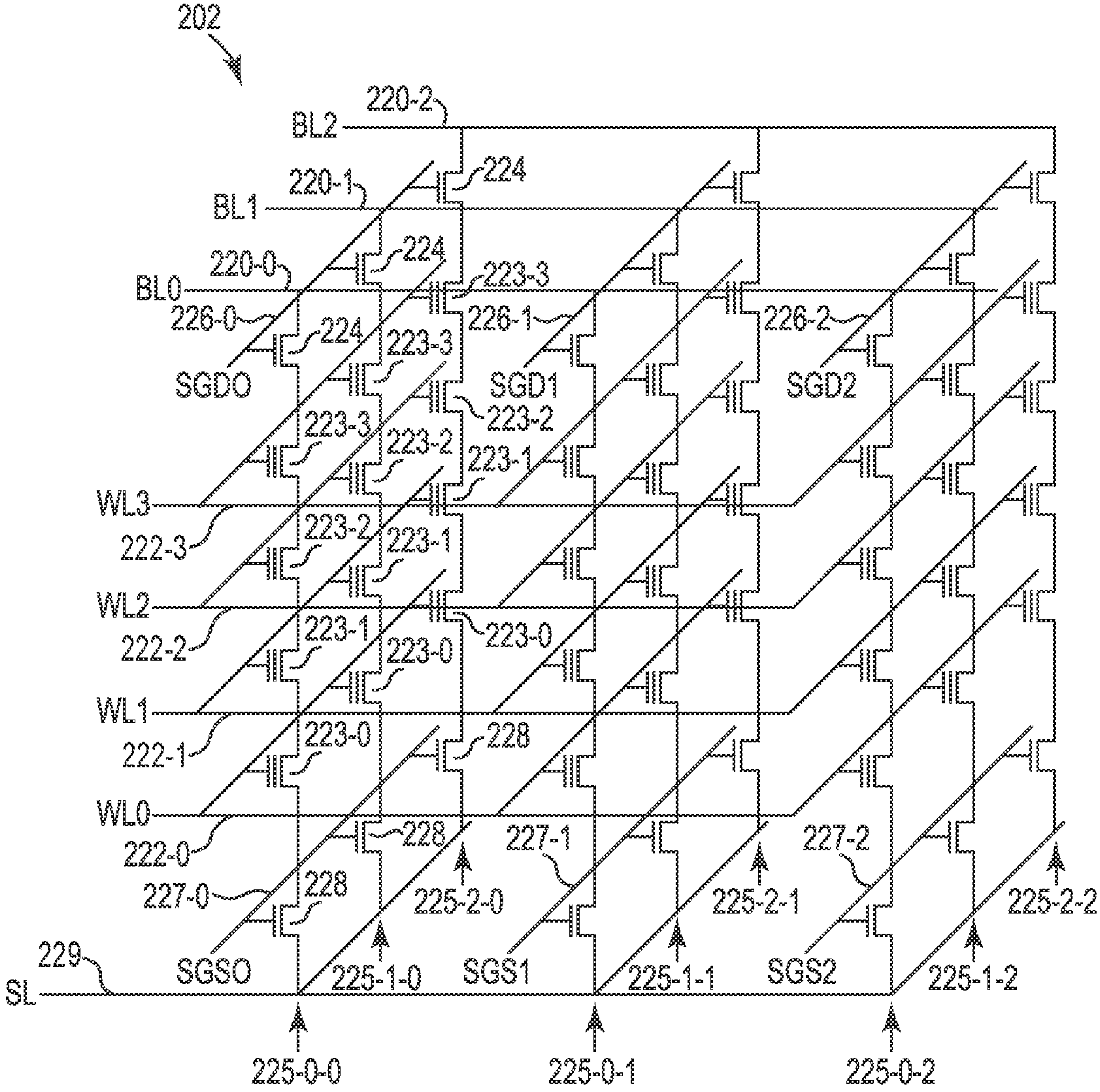
FIG. 2 is a schematic diagram illustrating an example memory array that can be operated in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 200 is a 3D NAND array (e.g., RG NAND array or a floating gate NAND array).

The memory array 200 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors or charge trap cells with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages (e.g., bias voltages) can be applied to the word lines 222, bit lines 220, and source line 229. The particular voltages applied depends on the memory operation being performed, and different voltages may be applied to the word lines 222 during a particular memory operation in order to store data in a cell (or page of cells) or read data from a cell. Example biasing schemes are described in more detail in association with FIGS. 3A and 3B.

Figure 3A:
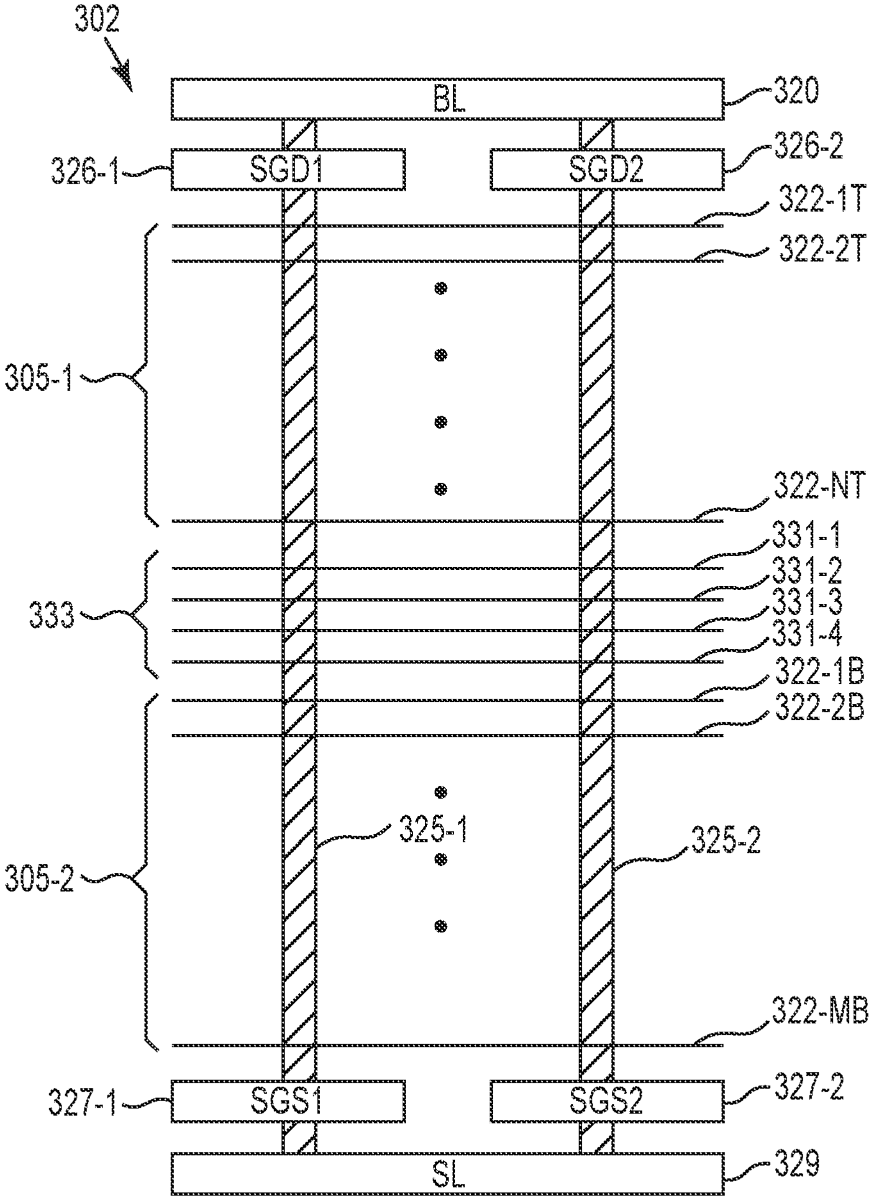
FIG. 3A schematically illustrates a portion of a memory array having multiple erase blocks per string and that can be operated in accordance with various embodiments of the present disclosure.

As described further in FIGS. 3A and 3B, the memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings (e.g., common channel) with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while other erase block(s) corresponding to the same group of strings is deselected (e.g., such that is not erased). As described further herein, the program status (e.g., quantity of word lines programmed versus erased) of selected erase blocks and unselected neighboring erase blocks affects the string current in the selected erase block during sensing operations. As one example, for a given sense voltage (e.g., read voltage) applied to a selected word line within a selected erase block, the sensed string current will vary depending on whether the neighbor erase block (e.g., deck) is fully programmed, partially programmed, or erased. As described herein, embodiments of the present disclosure can adjust the sense voltage applied to a selected word line based on a determined program status of the selected erase block and/or adjacent erase block in order to improve sensing accuracy, for example.

FIG. 3A schematically illustrates a portion of a memory array 302 having multiple erase blocks per string that can be operated in accordance with various embodiments of the present disclosure. FIG. 3B is a table illustrating bias voltages associated with performing operations on a memory array having multiple erase blocks per string in accordance with various embodiments of the present disclosure, such as the array 302 shown in FIG. 3A. The example shown can be a portion of the array 202 described in FIG. 2. The array portion 302 can be a portion of a physical block of memory cells that includes multiple erase blocks (e.g., decks); although, embodiments of the present disclosure are not limited to arrays comprising multiple erase blocks per physical block.

In this example, the array 302 includes a plurality/group of word lines 322-1T, 322-2T, . . . , 322-NT corresponding to a first erase block 305-1 (e.g., a top deck) and a plurality/group of word lines 322-1B, 322-2B, . . . , 322-MB corresponding to a second erase block 305-2 (e.g., bottom deck). The designators "N" and "M" can represent various numbers (e.g., 3 or more) and "N" and "M" can be the same number. Accordingly, embodiments are not limited to a particular quantity of word lines 322 for the top deck 305-1 or bottom deck 305-2 (the designator "T" corresponding to "top" and the designator "B" corresponding to "bottom"). The array 302 also includes a number of dummy word lines 331-1, 331-2, 331-3, and 331-4, which can be collectively referred to as word lines 331. The dummy word lines 331 correspond to a separation region 333 between the top deck 305-1 and bottom deck 305-2. Although four word lines 331 are illustrated, embodiments can include more or fewer than four dummy word lines 331 separating erase blocks corresponding to same strings.

The array portion 302 illustrates two strings 325-1 and 325-2 for case of illustration; however, embodiments can include many more strings 325. Memory cells are located at the intersections of the word lines 322/331 and strings 325, with the memory cells of a particular string 325 sharing a common channel region (e.g., pillar) as described in FIG. 2. The dummy word lines 331 can be coupled to dummy memory cells (e.g., cells that are not addressable to store user data).

As illustrated in FIG. 3A, a first end of the strings 325-1 and 325-2 can be coupled to a common source line 329 via respective select gate source lines 327-1 (SGS1) and 327-2 (SGS2). The second/opposite end of the strings 325-1 and 325-2 can be coupled to a bit line 320 via respective select gate drain lines 326-1 (SGD1) and 326-2 (SGD2). As such, the strings 325 (e.g., the cells thereof) can be individually accessed using the bit line 320 and select gates to which the lines 326-1 and 326-2 are coupled. Although only a single bit line 320 is shown, embodiments can include multiple bit lines such as shown in FIG. 2, for example.

As noted herein, in various embodiments, the top deck 305-1 and the bottom deck 305-2 can be read, programmed, and/or erased via separate operations even though the cells of the decks 305-1/305-2 share the same strings 325-1/325-2. For example, each one of the decks 305-1 and 305-2 can be individually programmed and/or erased without programming or erasing the other of the decks 305-1 and 305-2.

As described further herein, the quantity of word lines 322 programmed in the decks 305-1 and 305-2 affects the sensed current through the strings 325-1/325-2 responsive to a particular sense voltage (e.g., read voltage or program verify voltage) applied to a selected word line 322. As described below, the biasing voltages associated with a program verify operation are similar to the biasing voltages associated with a read operation. As an example, a particular program operation can include multiple (e.g., 2, 4, 8, 15) program verify operations, with the quantity of program verify strobes depending on the quantity of program states and/or the quantity of programming pulses corresponding to the program operation.

As described further below, particularly in association with FIG. 3B, FIG. 4, FIG. 5A-5B, FIG. 6, and FIG. 9, various embodiments of the present disclosure can include: tracking (via an external controller) respective erase block program statuses for a plurality of erase blocks of a memory device; providing (to the memory device) a command corresponding to a sensing operation to be performed on a selected access line and erase block program status information corresponding to the erase block and/or other erase blocks; and determining an offset by which a sense voltage to be applied to the selected access line is to be adjusted in association with performing the sensing operation based on the provided erase block program status information.

Column 371 of the table shown in FIG. 3B represents example biasing voltages applied to an array (e.g., 302) in association with performing a programming operation on a selected deck (e.g., top deck 305-1). Column 373 represents example biasing voltages applied to the array in association with performing a read operation or a program verify operation on a selected deck (e.g., 305-1). In this example, for purposes of deck program state tracking and associated sense voltage adjustment, the bottom deck 305-2 (e.g., the unselected deck) represents an aggressor deck (e.g., a deck whose program status affects the string current during a read of a selected deck) and the top deck 305-1 (e.g., the selected deck) represents a victim deck.

The example programming operation shown in FIG. 3B involves applying a programming voltage (Vpgm) to a selected word line (e.g., SELECTED WLn) within the selected deck (e.g., the top deck 305-1). The programming voltage can be applied to the selected word line as a plurality of pulses, for example, and is intended to increase the Vt of a selected cell by adding charge to its storage node (e.g., charge-trap layer or floating gate). As illustrated, the unselected word lines of the string (e.g., the remaining word lines of the top deck 305-1, the dummy word lines, and the word lines of the bottom deck 305-2) are biased with a program pass voltage (Vpass). The bit line 320 corresponding to the selected string is biased at 0V, the drain select gate 326 is biased at 3V, the source select gate 327 is biased at 0V, and the source line 329 is biased at 2V during the programming operation.

A programming operation involves performing program verify operations to determine when the Vt of the cells being programmed have reached a desired level. As such, a program verify operation essentially involves performing a read operation on the selected cells (e.g., the cells coupled to the selected word line). As shown in FIG. 3B, a read operation and/or a program verify operation can involve applying a read voltage (Vread) to the selected word line (SELECTED WLn), while applying a read pass voltage (Vpassr, Vpassr1, or Vpass_v) to the unselected word lines of the string (e.g., the remaining word lines of the top deck 305-1, the dummy word lines, and the word lines of the bottom deck 305-2). The read pass voltage is designed to place the unselected cells of a string in a conductive state in order to allow current to flow through the string depending on the applied read voltage (Vread) and Vt of the selected cell. In this manner, the read or program verify operation can be used to determine if the Vt of the selected cell is above or below a particular level (e.g., above or below Vread).

However, as described herein, the determined Vt of the cell is affected by program status of the word lines of the selected deck 305-1 and of the unselected deck 305-2 since said program statuses affect the sensed string current.

In this example, the bit line 320 corresponding to the selected string is biased at 0.5V, the drain select gate 326 is biased at 5V, the source select gate 327 is biased at 5V, and the source line 329 is biased at 0V during the read or program verify operation. For multistate memory cells, a read operation can include multiple strobes to distinguish between the multiple possible states of a cell, as described further in association with FIGS. 5A and 5B.

In a number of embodiments, and as shown in FIG. 3B, the unselected word lines (e.g., WLn+1 and WLn−1) adjacent to the selected word line (e.g., WLn) can be biased at a higher read pass voltage (e.g., Vpassr1) as compared to the other unselected word lines, which are biased at Vpassr. As an example, Vpassr1 can be 8.5V-9.5V and Vpassr can be 8V. The increased Vpassr1 voltage can counteract a "pull down" voltage on WLn+1 and WLn−1 that results from coupling between WLn+1/WLn−1 and WLn, depending on the bias (Vread) on WLn. Such pull down can result in cells coupled to WLn+1/WLn−1 not being fully conductive (e.g., turned on) during the read, which can result in read errors. However, the increased Vpassr1 (as compared to Vpassr) can result in increased read disturb stress on the cells coupled to WLn+1 and WLn−1 (e.g., for cells coupled to WLn+1/WLn−1 and that have relatively low Vts).

As described herein, the values of the read voltage (Vread) applied to the selected word line, the read pass voltages (e.g., Vpassr1 and Vpassr) applied to the unselected word lines of the selected deck, and/or the values of the read pass voltages (e.g., Vpassr_v) applied to the word lines of the unselected deck can be adjusted based on the tracked program status of the decks 305-1/305-2. For example, if a particular read voltage (e.g., Vread=3V) is applied to the selected word line in association with a first read operation in which the unselected word lines are erased, and a subsequent read operation is performed on the selected word line after the unselected deck has been programmed (or partially programmed), then the read voltage can be adjusted (e.g., increased to 3.1V, which corresponds to a 0.1V offset amount) to compensate for the reduced string current occurring due to the increased quantity of programmed word lines of the unselected deck. The Vread offset amount can be variable and determined based on the quantity of word lines programmed in the selected deck and the quantity of word lines programmed in the unselected deck, which can be tracked. The Vread offset amount can be determined in various manners. For example, the Vread offset amount can be determined based on a total quantity of programmed word lines in the combination of the selected deck and one or more unselected decks (e.g., depending on how many decks are coupled to the string). As described below in association with FIG. 4, the Vread offset amount can be based on various offset factors that can vary depending on whether the deck is selected or unselected and/or depending on whether the deck is a top deck or a bottom deck, for example.

As another example, if the word lines of the unselected deck 305-2 are determined to be in the erased state, then a reduced read pass voltage (Vpassr_v) can be used as compared to a read pass voltage used when the unselected deck is programmed in order to compensate for the increased string current resulting from erased word lines as compared to programmed word lines (e.g., the reduced read pass voltage can be used to emulate programmed cells). That is, the read pass voltage Vpassr_v can be a variable voltage that is adjusted depending on the tracked program status of the unselected deck 305-2. As an example, the read pass voltage Vpassr_v may be 8V for programmed word lines and a reduced value (e.g., to 7.9V, 7.5V, 7V, etc.) for erased word lines.

FIG. 4 is a table illustrating offset factors that can be used to adjust sense voltages in association with performing sensing operations on a memory array having multiple erase blocks per string in accordance with various embodiments of the present disclosure. Column 461 indicates the particular erase block (e.g., deck) selected for a read (or program verify) operation, with "DECK1" corresponding to a bottom deck (e.g., deck 305-2 shown in FIG. 3) and "DECK2" corresponding to a top deck (e.g., deck 305-1 shown in FIG. 3) in this example. Column 463 indicates the read offset factors due to DECK1 (e.g., due to the programmed status of DECK1), and column 465 indicates the read offset factors due to DECK2 (e.g., due to the programmed status of DECK2).

The table includes a number of read offset factors 467-1 ("A"), 467-2 ("B"), 469-1 ("C"), and 469-2 ("D"). In this example, the read offset factors A and B correspond to DECK1 and DECK 2, respectively, when the selected word line (e.g., the word line being read or verified) is in DECK1 (e.g., when DECK1 is the selected deck and DECK2 is the unselected deck). Similarly, the read offset factors C and D correspond to DECK1 and DECK 2, respectively, when the selected word line is in DECK2 (e.g., when DECK2 is the selected deck and DECK1 is the unselected deck). Each of the offset factors can represent a factor used to determine an overall offset voltage amount (e.g., in mV) to be applied to a read (or program verify) voltage applied to a selected word line in accordance with embodiments described herein. The overall read voltage offset can be the sum of the offset values determined based on offset factors A and B (e.g., when DECK1 is the selected deck) or the sum of the offset values determined based on offset factors C and D (e.g., when DECK2 is the selected deck).

In operation, the read voltage offset values based on the respective offset factors A, B, C, and D can be determined in various manners. For example, the read voltage offset values can be determined by multiplying the respective offset factors A, B, C, and D by the quantity of word lines programmed in the corresponding deck. For instance, if DECK1 is the selected deck, the read voltage offset value can be determined as [A×(quantity of programmed word lines in DECK1)+B×(quantity of programmed word lines in DECK2]. In various embodiments, the offset factors A, B, C, and D can have different values; however, embodiments are not so limited (e.g., two or more of the offset factors can have the same value). As an example, an offset factor may be different for different decks depending on their physical location within a physical block (e.g., for a deck nearer to a source side as opposed to a deck nearer to a drain side) in order to account for resistance variations of the string.

In various embodiments, the read voltage offset values may be determined based on a quantization factor used to normalize decks to a particular granularity (e.g., 1/16, 1/8, 1/4, etc.). Such a quantization factor can reduce the overhead associated with providing deck program state information to the memory device (e.g., from a host or system controller used to track the information). For instance, if the quantization factor is normalized to 1/8 granularity, then 3 bits would be sufficient to indicate an approximate extent to which a deck is programmed (e.g., erased, 1/8 programmed, 1/4 programmed, 3/8 programmed, 1/2 programmed, 5/8 programmed, ¾ programmed, ⅞ programmed, or fully programmed). A look-up table on the memory device can be used to store the applicable read voltage offset values corresponding to the various determined deck program statuses.

Figure 5A:
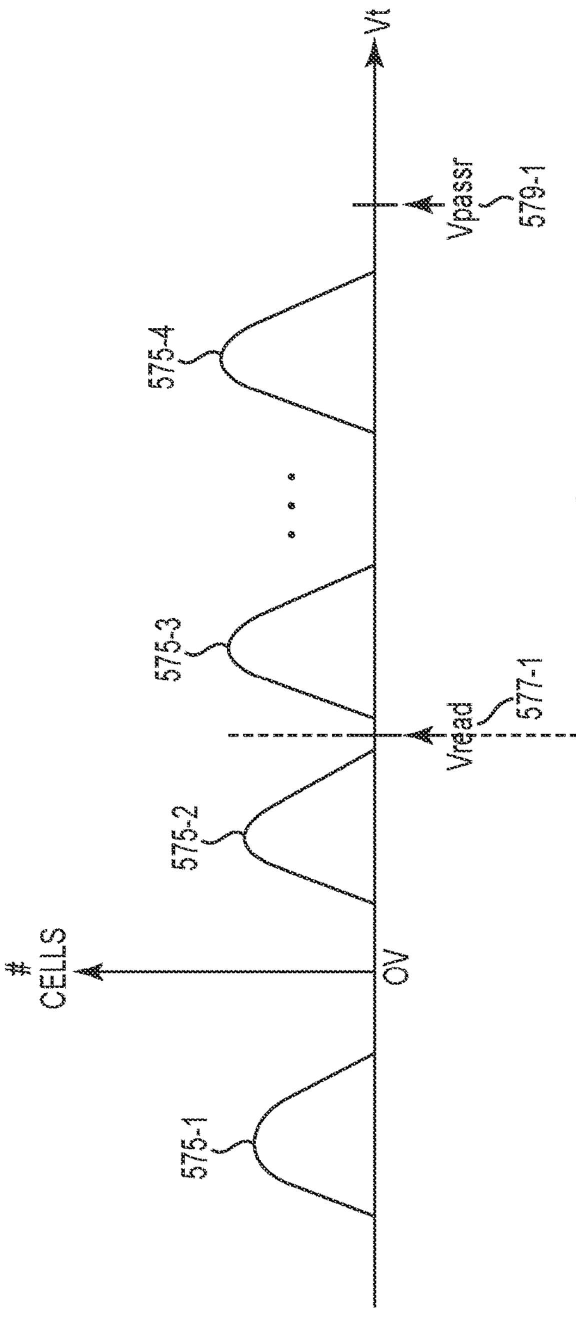
FIG. 5A illustrates example threshold voltage distributions associated with memory cells of an array having multiple erase blocks in accordance with various embodiments of the present disclosure.
Figure 5B:
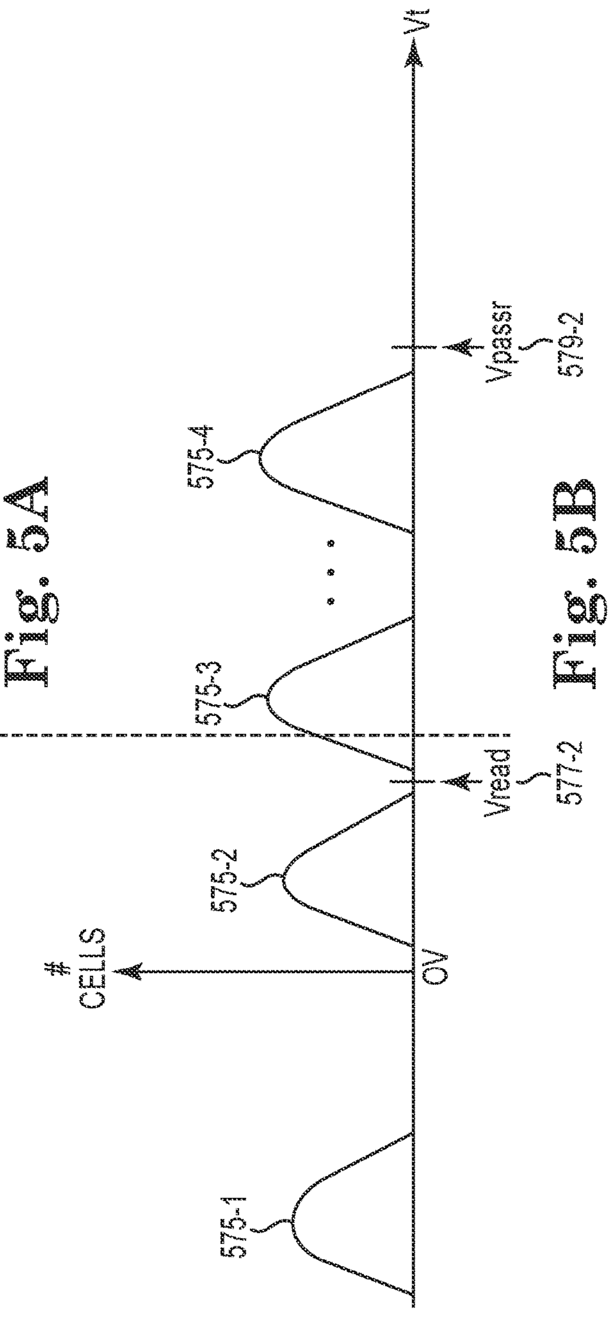
FIG. 5B illustrates example threshold voltage distributions and an adjusted read voltage in accordance with various embodiments of the present disclosure.

FIG. 5A illustrates example threshold voltage distributions associated with memory cells of an array having multiple erase blocks in accordance with various embodiments of the present disclosure. FIG. 5B illustrates example threshold voltage distributions and an adjusted read voltage in accordance with various embodiments of the present disclosure.

The Vt distributions 575-1, 575-2, 575-3, and 575-4, which can be referred to collectively as Vt distributions 575, represent states to which memory cells can be programmed. As an example, the Vt distributions 575 can correspond to a group of programmed cells of a particular erase block (e.g., victim deck). In this example, FIG. 5A illustrates the read voltage 577-1 (Vread) applied to the selected word line to distinguish between states corresponding to Vt distributions 575-2 and 575-3 at a particular (e.g., initial) time, while FIG. 5B illustrates an adjusted read voltage 577-2 used to distinguish between the states corresponding to the Vt distributions 575-2 and 575-3 at a different (e.g., later time). The adjusted read voltage 577-2 is determined in accordance with various embodiments described herein. For example, the value of read voltage 577-2 is determined by adding a read voltage offset to the read voltage 577-1. As described above, the read voltage offset can be determined, for example, based on erase block program state information (e.g., the quantity of word lines programmed in the selected erase block and the quantity of word lines programmed in one or more unselected erase blocks), which can be tracked (e.g., monitored) by a system controller.

The Vt distributions 575 are shown as being shifted downward in FIG. 5B as compared to FIG. 5A in order to demonstrate the effect of a different (e.g., increased) string current resulting from fewer word lines being programmed in the selected deck and unselected deck, which causes the Vt of the cell being read to appear lower than its actual value. In the event that the quantity of programmed word lines in the selected deck and unselected deck were increased, then the offset applied to the read voltage 577-1 would be higher (e.g., Vread 577-2 would be greater than Vread 577-1) in order to compensate for the decreased string current.

FIG. 5A and FIG. 5B also illustrate a read pass voltage (Vpassr) 579-1 and 579-2 (e.g., a voltage higher than the uppermost Vt state 575-4) at which word lines coupled to the memory cells are biased such that the memory cells will conduct regardless of their programmed state. As described above, embodiments of the present disclosure can include adjusting (e.g., decreasing) the read pass voltage on unselected word lines in order to compensate for the increased string current as compared to programmed word lines (e.g., to emulate programmed cells).

Although not shown in FIG. 5A and FIG. 5B, the read pass voltage applied to unselected erased word lines (e.g., word lines coupled to cells in Vt state 575-1) can have a reduced read pass voltage as compared to the read pass voltage applied to programmed word lines in order to emulate programmed word lines.

Figure 6:
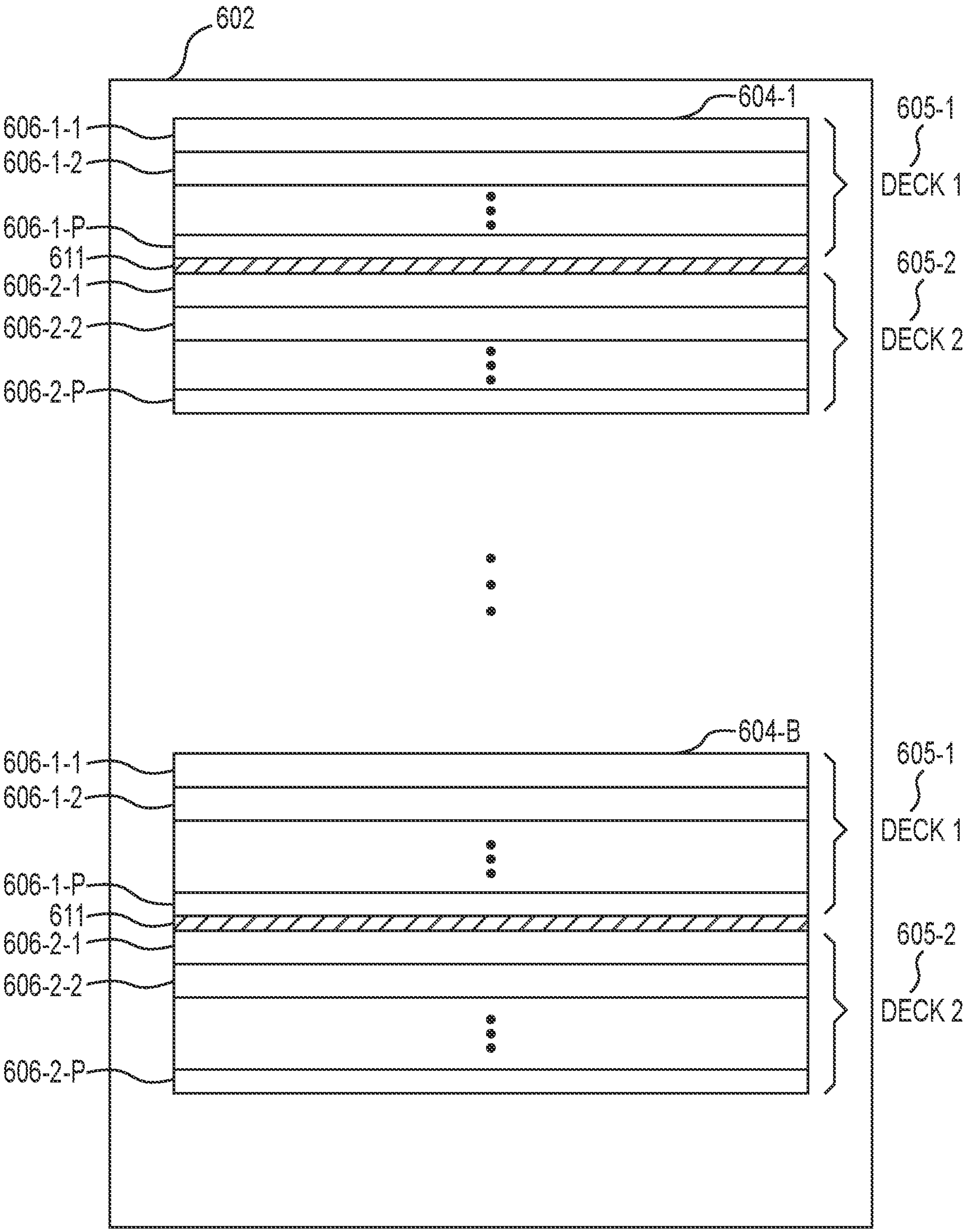
FIG. 6 illustrates a portion of a memory array having multiple erase blocks per string and that can be operated in accordance with various embodiments of the present disclosure.

FIG. 6 illustrates a portion of a memory array 602 having multiple erase blocks per string in accordance with various embodiments of the present disclosure. The memory array 602 includes multiple physical blocks 604-1, . . . , 604-B and can be operated in accordance with one or more embodiments of the present disclosure. The indicator "B" is used to indicate that the array 602 can include a number of physical blocks 604. As an example, the number of physical blocks in array 602 can be 128 blocks, 512 blocks, or 1,024 blocks, but embodiments are not limited to a particular multiple of 128 or to any particular number of physical blocks in an array 602. The memory array 602 can be, for example, a NAND flash memory array (e.g., a 3D NAND flash array such as array 102, 202, and/or 302).

Each of the physical blocks 604-1, . . . , 604-B includes a first erase block 605-1 (DECK_1) and a second erase block 605-2 (DECK_2) separated by a region 611, which can correspond to a region of dummy word lines such as word lines 331 shown in FIG. 3A. As described above, the decks 605-1 and 605-2 are commonly coupled to the strings of the blocks 604-1, . . . , 604-B with the decks 605-1 and 605-2 being separately erasable via a block erase operation (e.g., deck 605-1 can be erased without erasing deck 605-2 and vice versa). Although the physical blocks 604 are shown as including two decks, embodiments are not so limited. For example, the physical blocks 604 can include more than two decks and in some embodiments different physical blocks 604 can include different quantities of decks.

Each deck 605-1 and 605-2 can comprise a number of physical pages, which can correspond to a "row" of the array corresponding to a particular word line. As shown, deck 605-1 comprises pages 606-1-1, 606-1-2, . . . , 606-1-P, and deck 605-2 comprises pages 606-2-1, 606-2-2, . . . , 606-2-P. The designator "P" is used to indicate that the decks 605-1 and 605-2 can comprise a plurality of pages/rows. Each physical page (collectively referred to as pages 606) can store multiple logical pages of data. A page can refer to a unit of programming and/or reading (e.g., a group of cells that are programmed and/or read together as a functional group).

Figure 7:
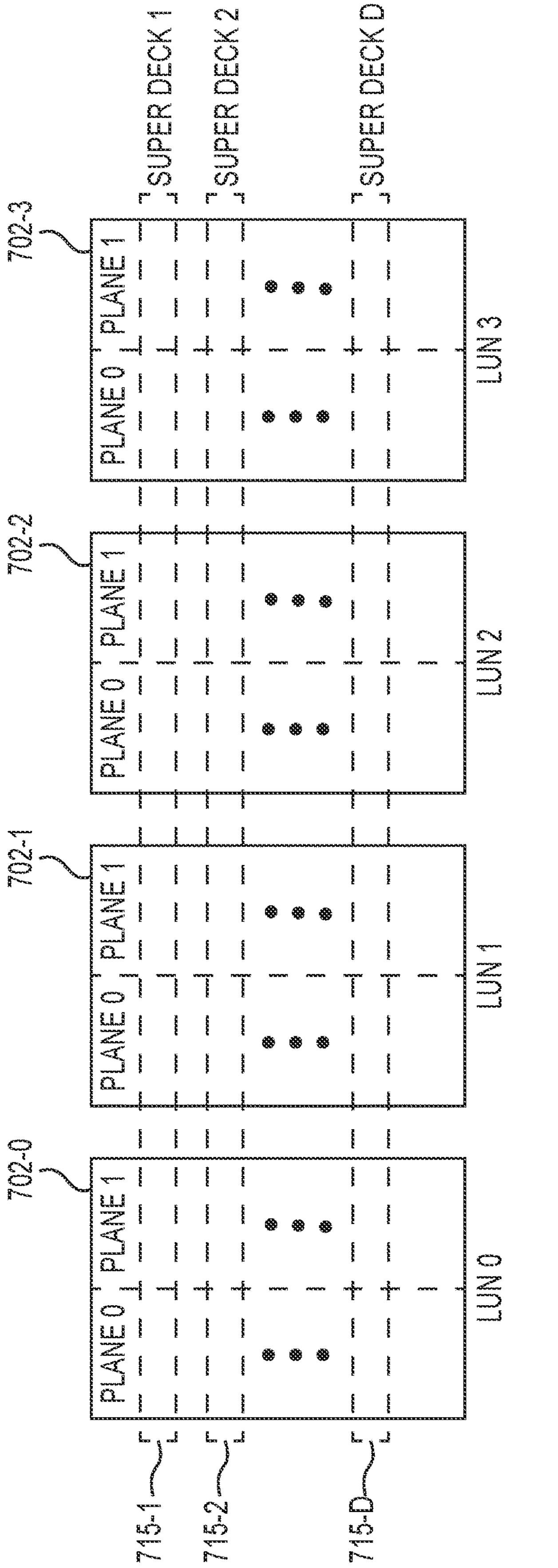
FIG. 7 illustrates a portion of a memory device having multiple erase blocks per string in accordance with various embodiments of the present disclosure.

FIG. 7 illustrates a portion of a memory device having multiple erase blocks in accordance with various embodiments of the present disclosure. In various embodiments, the physical blocks of a memory array can be organized into planes. For example, FIG. 7 illustrates memory arrays 702-0, 702-1, 702-2, and 702-3 each divided into a first plane (PLANE 0) of physical blocks and a second plane (PLANE 1) of physical blocks. Embodiments are not limited to a particular quantity of planes per array. Each array 702-0, 702-1, 702-2, and 702-3 corresponds to a respective logical unit (LUN) LUN0, LUN1, LUN2, and LUN3. Each LUN can correspond to a different memory device (e.g., memory device 100 shown in FIG. 1); however, embodiments are not so limited. For example, a memory device (e.g., die) can include multiple LUNs. A LUN can, for example, correspond to a smallest unit that can independently execute commands and report status.

The physical blocks of the planes can comprise multiple erase blocks sharing common strings as described herein. The physical blocks can be grouped into "super blocks" with each super block comprising a physical block from each plane (e.g., PLANE 0 and PLANE 1) across multiple LUNs (e.g., across multiple arrays 702). Similarly, embodiments of the present disclosure an include a number of super decks 715-1 (SUPER DECK_1), 715-2 (SUPER DECK_2), . . . , 715-D (SUPER DECK_D). Each super deck (or super erase block) 715 can comprise a deck from each plane across multiple LUNs. For example, a first super deck 715-1 (SUPER DECK_1) can comprise a deck from plane 0 of LUN0, a deck from plane 1 of LUN1, a deck from plane 0 of LUN1, a deck from plane 1 of LUN1, a deck from plane 0 of LUN2, a deck from plane 1 of LUN2, a deck from plane 0 of LUN3, and a deck from plane 1 of LUN3.

Embodiments of the present disclosure can monitor program status on a super deck level as well as, or instead of, on a deck level. For instance, consider an example in which the constituent decks of a super deck 715-1 share common strings with the respective constituent decks of a super deck 715-2 (e.g., super decks 715-1 and 715-2 are located in a same physical super block). The decks of super deck 715-1 can be erased together as a group and therefore can be considered an aggressor super deck since their programmed status can contribute to a read voltage offset of the victim decks of the corresponding victim super deck 715-2.

Figure 8:
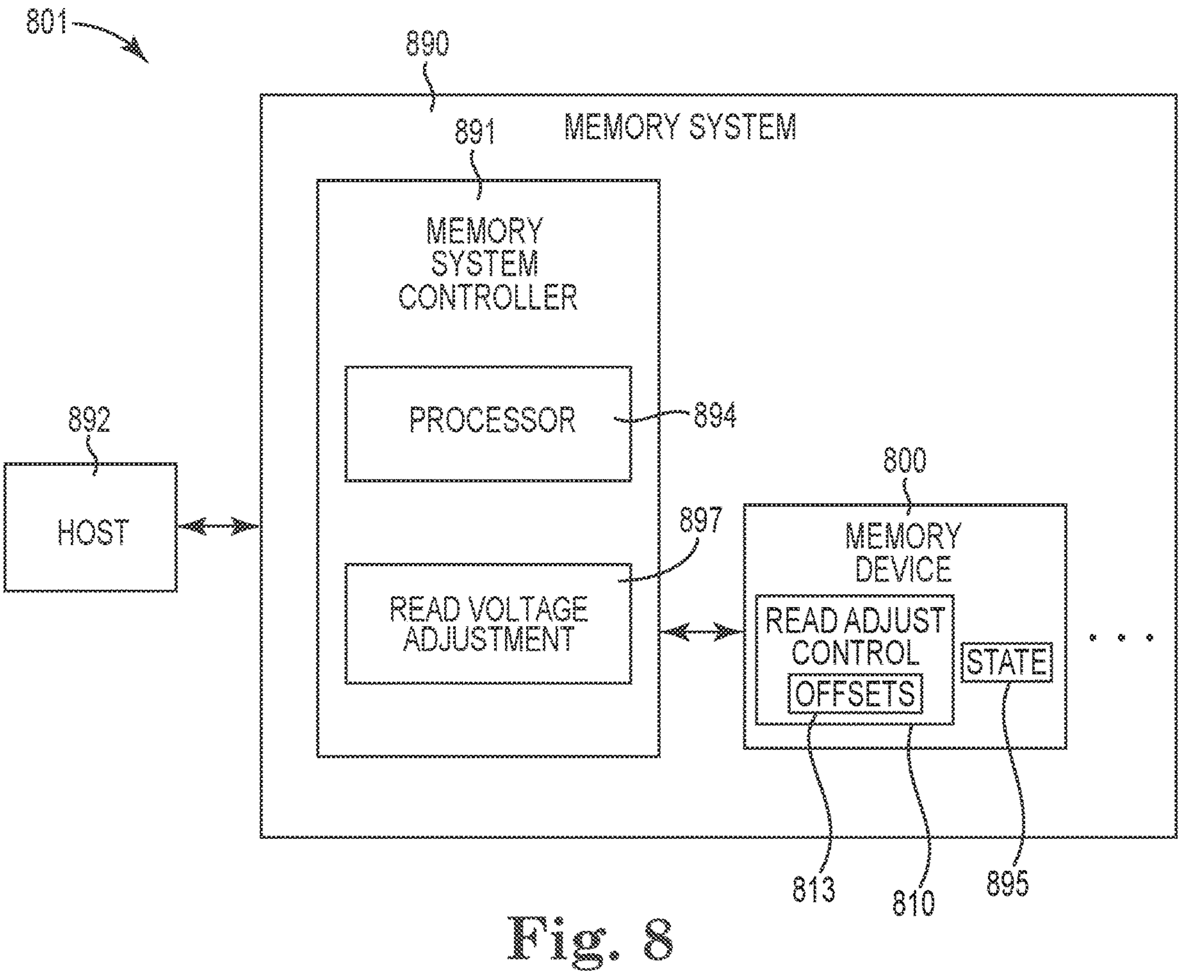
FIG. 8 illustrates an example computing system having a memory system for performing sense voltage adjustment among multiple erase blocks in accordance with various embodiments of the present disclosure.

FIG. 8 illustrates an example computing system having a memory system for performing sense voltage adjustment among multiple erase blocks in accordance with various embodiments of the present disclosure. As shown in FIG. 8, the memory system 890 includes a system controller 891 and a number of memory devices 800, which can be memory devices such as device 100 described in FIG. 1 (e.g., memory devices comprising memory arrays having multiple erase blocks coupled to common strings).

In some embodiments, the memory system 890 is a storage system. An example of a storage system is a solid-state drive (SSD). In some embodiments, the memory system 890 is a hybrid memory/storage sub-system. In general, the computing environment shown in FIG. 8 can include a host system 892 that uses the memory system 890. For example, the host system 892 can write data to the memory system 890 and read data from the memory system 890.

The memory system controller 891 (hereinafter referred to as "controller") can communicate with the memory devices 800 to perform operations such as reading data, writing data, or erasing data at the memory devices 800 and other such operations. The controller 891 can include hardware such as one or more integrated circuits and/or discrete components, a buffer memory, or a combination thereof. The controller 891 can include a microcontroller, special purpose logic circuitry (e.g., a field programmable gate array (FPGA), an application specific integrated circuit (ASIC), etc.), or other suitable processing circuitry. The controller 891 can include a processing device (e.g., processor 894) configured to execute instructions stored in local memory (not shown).

In this example, the controller 891 includes a read voltage adjustment component 897 that can be responsible for tracking erase block program state information and providing such information along with commands to the memory device 800 in accordance with various embodiments described herein. For example, the tracked erase block program state information can indicate the quantity of word lines programmed in a number of erase blocks (e.g., a selected erase block and one or more unselected erase blocks). In a number of embodiments, the erase block program state information can comprise a plurality of bits indicative of a percentage or portion of the total quantity word lines programmed in the victim and/or aggressor erase blocks.

In general, the controller 891 can receive commands or operations from the host system 892 and can convert the commands or operations into instructions or appropriate commands to achieve the desired access to the memory devices 800. The controller 891 can be responsible for other operations such as wear leveling operations, garbage collection operations, error detection and error-correcting code (ECC) operations, encryption operations, caching operations, and address translations between a logical block address and a physical block address that are associated with the memory devices 800.

As illustrated in FIG. 8, the memory device 800 can include a read adjust control component 810, which can correspond to control circuitry (e.g., control circuitry 110 shown in FIG. 1). The component 810 can be receive erase block program state information from the controller 891 and can include a component 813 that can determine appropriate bias voltage offsets (e.g., read voltage offsets, program verify voltage offsets, and/or read pass voltage offsets) to apply to access lines in association with performing sensing operations in accordance with embodiments described herein. The component 813 can include a look-up table, for example, used to determine the appropriate bias voltage offsets based on the tracked erase block program state information.

In a number of embodiments, the memory device 800 can include a component 895 that can store erase block program state information that can be passed to the controller 891 in the event of a power failure, for example. The component 895 can be a relatively small memory (e.g., DRAM, SRAM, etc.).

The host system 892 can be a computing device such as a desktop computer, laptop computer, network server, mobile device, or other such computing device that includes a memory and a processing device. The host system 892 can include, or be coupled to, the memory system 890 so that the host system 892 can read data from or write data to the memory system 890. The host system 892 can be coupled to the memory system 890 via a physical host interface (not shown in FIG. 8). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 892 and the memory system 890. The host system 892 can further utilize an NVM Express (NVMe) interface to access the memory devices 800 when the memory system 890 is coupled with the host system 892 by the PCIe interface. The physical host interface can provide an interface for passing control, address, data, and other signals between the memory system 890 and the host system 892.

While the example memory system 890 in FIG. 8 has been illustrated as including the controller 891, in another embodiment of the present disclosure, a memory system 890 may not include a controller 891, and can instead rely upon external control (e.g., provided by a processor or controller separate from the memory system 890, such as by host 892 communicating directly with the memory devices 800).

Although the memory system 890 is shown as physically separate from the host 892, in a number of embodiments the memory system 890 can be embedded within the host 892. Alternatively, the memory system 890 can be removable from the host 892.

Figure 9:
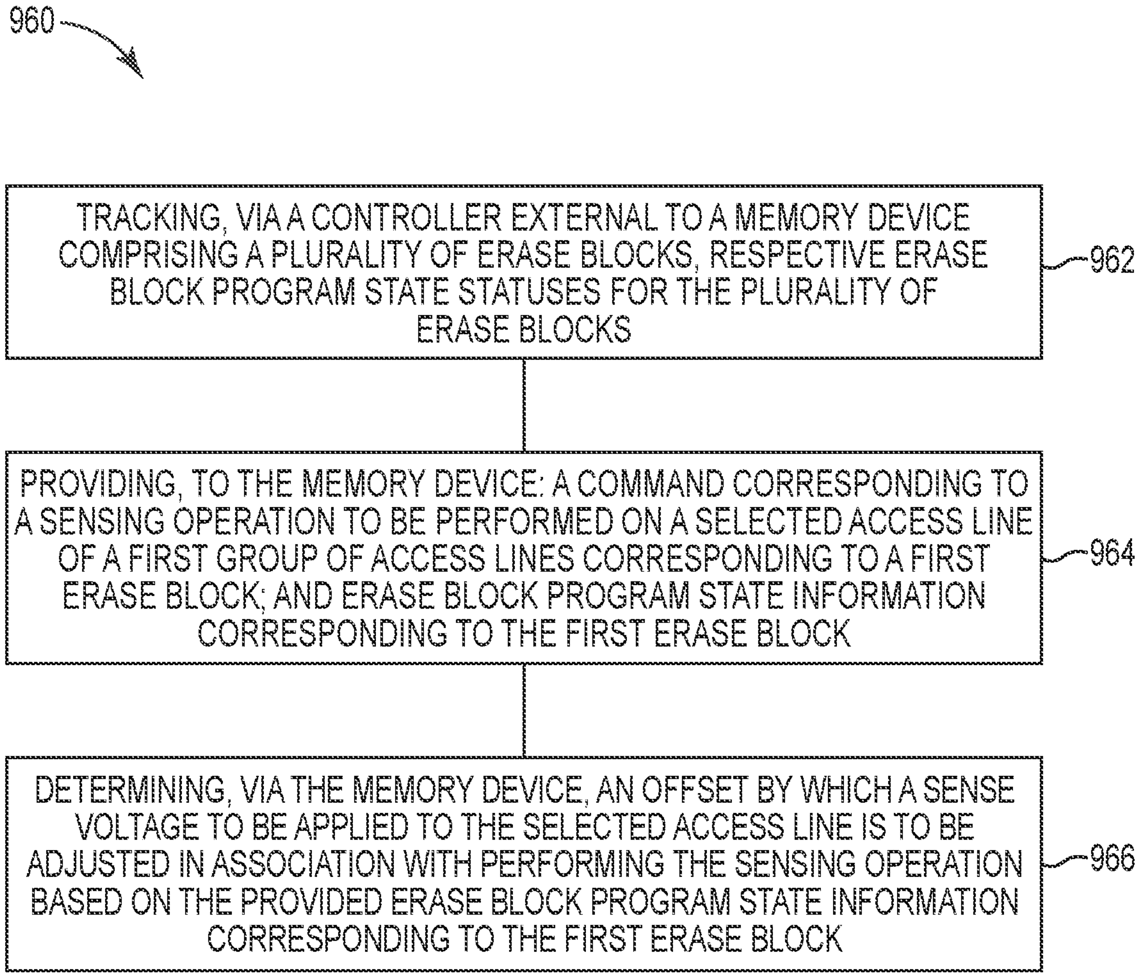
FIG. 9 is a flow diagram that illustrates an example method for sense voltage adjustment among multiple erase blocks in accordance with various embodiments of the present disclosure.

FIG. 9 is a flow diagram that illustrates an example method for sense voltage adjustment among multiple erase blocks in accordance with various embodiments of the present disclosure. The method 960 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 960 is performed by the control circuitry 110 of FIG. 1 and/or the controller 891 of FIG. 8. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At step 962, the method includes tracking, via a controller external to a memory device comprising a plurality of erase blocks, respective erase block program state statuses for the plurality of erase blocks. At step 964, the method includes providing, to the memory device: a command corresponding to a sensing operation (e.g., read or program verify) to be performed on a selected access line of a first group of access lines corresponding to a first erase block; and erase block program state information corresponding to the first erase block. At step 966, the method includes determining, via the memory device, an offset by which a sense voltage to be applied to the selected access line is to be adjusted in association with performing the sensing operation based on the provided erase block program state information corresponding to the first erase block.

As described herein, in various embodiments, the memory device can comprise one or more additional erase blocks which can be coupled to a same string as the first erase block. Accordingly, the method can also include determining, via the memory device, the offset by which the sense voltage to be applied to the selected access line is to be adjusted in association with performing the sensing operation based on erase block program state information corresponding to one or more erase blocks in addition to the firsterase block. That is, the offset can be determined based on the erase block program status of multiple erase blocks.

As used herein, an "apparatus" can refer to various structural components. For example, the computing system 801 shown in FIG. 8 can be considered an apparatus. Alternatively, the host 892, the controller 891, and the memory device 800 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 - a memory array comprising a plurality of strings of memory cells, wherein each string of the plurality of strings comprises:
   - a first group of memory cells coupled to a first group of access lines and corresponding to a first erase block; and
   - a second group of memory cells coupled to a second group of access lines and corresponding to a second erase block; and
 - control circuitry coupled to the memory array and configured to:
   - receive a command corresponding to a sensing operation to be performed on a selected access line of the first group of access lines; and
   - determine an adjusted sense voltage to be applied to the selected access line in association with performing the sensing operation, wherein the adjusted sense voltage is based on:
     - a quantity of the first group of access lines that are programmed; and
     - a quantity of the second group of access lines that are programmed; and
   - wherein the adjusted sense voltage is further determined based on a first offset factor corresponding to the first erase block and a second offset factor corresponding to the second erase block;
   - wherein the first offset factor is multiplied by the quantity of the first group of access lines that are programmed to determine a first offset voltage;
   - wherein the second offset factor is multiplied by the quantity of the second group of access lines that are programmed to determine a second offset voltage; and
   - wherein the adjusted sense voltage is based on an overall sense voltage offset which is a sum of the first offset voltage and the second offset voltage.

2. The apparatus of claim 1, wherein the sensing operation is a read operation or a program verify operation.

3. The apparatus of claim 1, wherein the adjusted sense voltage is different from a default sense voltage corresponding to the sensing operation, and wherein:
 - the quantity of the first group of access lines that are programmed corresponds to a first quantization factor; and
 - the quantity of the second group of access lines that are programmed corresponds to a second quantization factor.

4. The apparatus of claim 1, further comprising an external system controller configured to:
 - track erase block program state information corresponding to the plurality of erase blocks;
 - determine a quantization factor based on the tracked erase block program state information; and
 - provide the quantization factor to the control circuitry with the command corresponding to the sensing operation; and
 - wherein the quantization factor corresponds to:
   - a portion of a total quantity of access lines of the first erase block that are in a programmed state; or
   - a portion of a total quantity of access lines of the second erase block; or
 - both.

5. The apparatus of claim 1, wherein the first offset factor and the second offset factor are the same.

6. The apparatus of claim 1, wherein the control circuitry is further configured to:
 - receive a subsequent command corresponding to a subsequent sensing operation to be performed on a selected access line of the second group of access lines; and
 - determine an adjusted sense voltage to be applied to the selected access line of the second group of access lines in association with performing the subsequent sensing operation, wherein the adjusted sense voltage is determined based on a third offset factor corresponding to the first erase block and a fourth offset factor corresponding to the second erase block;
 - wherein the third offset factor is used to determine a third offset voltage;
 - wherein the fourth offset factor is used to determine a fourth offset voltage; and
 - wherein the adjusted sense voltage to be applied to the selected access line of the second group of access lines is based on a sum of the third offset voltage and the fourth offset voltage.

7. The apparatus of claim 1, wherein the control circuitry is configured to, in association with performing the sensing operation on the selected access line of the first erase block:
 - apply a read pass voltage to programmed access lines of the second erase block; and
 - apply a reduced read pass voltage to erased access lines of the second erase block in order to emulate programmed access lines.

8. A method, comprising:
 - tracking, via a controller external to a memory device comprising a plurality of erase blocks, respective erase block program state statuses for the plurality of erase blocks;
 - providing, to the memory device:
   - a command corresponding to a sensing operation to be performed on a selected access line of a first group of access lines corresponding to a first erase block or of a second group of access lines corresponding to a second erase block; and
   - erase block program state information corresponding to the first erase block and erase block program state information corresponding to the second erase block; and
 - determining, via the memory device, an offset by which a sense voltage to be applied to the selected access line is to be adjusted in association with performing the sensing operation based on the provided erase block program state information corresponding to the first erase block and the provided erase block program state information corresponding to the second block;
 - wherein, for a first particular determined quantity of programmed access lines of the first group of access lines and a second particular determined quantity of programmed access lines of the second group of access lines, the offset by which the sense voltage to be applied to the selected access line is adjusted is a first offset voltage or a second offset voltage depending on whether the selected access line is within the first erase block or the second erase block; and
 - wherein the first offset voltage is different than the second offset voltage.

9. The method of claim 8, wherein the first group of access lines and the second group of access lines correspond to a memory array comprising a plurality of strings of memory cells, wherein a first string of the plurality of strings comprises:

a first group of memory cells coupled to the first group of access lines and corresponding to the first erase block; and a second group of memory cells coupled to the second group of access lines and corresponding to the second erase block; and wherein the method further comprises:

determining, via the memory device, the offset by which the sense voltage to be applied to the selected access line is to be adjusted in association with performing the sensing operation by, responsive to the selected access line being within the first erase block determining the first offset voltage by:

determining a first voltage offset value by multiplying a first offset factor corresponding to the first erase block by a first quantity of the first group of access lines determined to be programmed;

determining a second voltage offset value by multiplying a second offset factor corresponding to the second erase block by a second quantity of the second group of access lines determined to be programmed; and summing the first voltage offset value and the second voltage offset value.

10. The method of claim 9, wherein the memory device comprises a third erase block including a third group of access lines corresponding to the memory array, wherein the first string further comprises:

a first group of memory cells coupled to the first group of access lines and corresponding to the first erase block; and a third group of memory cells coupled to the third group of access lines and corresponding to the third erase block; and wherein the method further comprises:

determining, via the memory device, the offset by which the sense voltage to be applied to the selected access line is to be adjusted in association with performing the sensing operation based on erase block program state information corresponding to the third erase block.

11. An apparatus, comprising:

a memory device comprising a memory array comprising a plurality of erase blocks; and a controller external to the memory device and configured to:

track respective erase block program state statuses for the plurality of erase blocks;

provide, to the memory device:

a command corresponding to a sensing operation to be performed on a selected access line of the memory array; and erase block program state information corresponding to a first erase block and erase block program state information corresponding to a second erase block coupled to a same string as the first erase block; and wherein the memory device is configured to determine an offset by which a sense voltage to be applied to the selected access line is to be adjusted in association with performing the sensing operation based on the provided erase block program state information corresponding to the first erase block and the provided erase block program state information corresponding to the second erase block;

wherein for a first particular quantity of access lines in the first erase block determined to be programmed and a first particular quantity of access lines in the second erase block determined to be programmed, the offset by which the sense voltage to be applied to the selected access line is to be adjusted in association with performing the sensing operation is determined to be different responsive to the selected access line being within the first erase block than if the selected access line is within the second erase block.

12. The apparatus of claim 11, wherein the command comprises the erase block program state information corresponding to the first erase block.

13. The apparatus of claim 11, wherein the first erase block comprises a first group of access lines, and wherein the erase block program state information corresponding to the first erase block indicates a quantized portion of the first group of access lines that are programmed.

14. The apparatus of claim 11, wherein the memory device is configured to, in response to receiving a particular command from the controller:

generate current erase block program state information corresponding to one or more of the plurality of erase blocks; and provide the current erase block program state information to the controller.

15. The apparatus of claim 11, wherein the erase block program state information comprises three or fewer bits.

16. The apparatus of claim 11, wherein the apparatus comprises a memory sub-system, wherein the controller comprises a sub-system controller, and wherein the memory device is a NAND flash memory device.

* * * * *